United States Patent [19]
Iseli et al.

[11] Patent Number: 4,503,128
[45] Date of Patent: Mar. 5, 1985

[54] THERMALLY SPRAYABLE CERAMICS

[76] Inventors: Robert W. Iseli, 1919 Beechwood Dr., Florence, Ala. 35630; Herbert Herman, 11 Meroke Trail, Port Jefferson, N.Y. 11777

[21] Appl. No.: 568,265

[22] Filed: Jan. 4, 1984

Related U.S. Application Data

[63] Continuation of Ser. No. 294,250, Aug. 19, 1981, abandoned.

[51] Int. Cl.³ ............... B32B 9/04; B32B 15/04; B32B 15/20
[52] U.S. Cl. ................... 428/446; 423/327; 428/469; 428/472; 501/9; 501/119
[58] Field of Search ............... 428/446, 428; 427/125; 501/80, 119, 7, 9; 423/327; 65/33

[56] References Cited

U.S. PATENT DOCUMENTS

| | | | |
|---|---|---|---|
| 3,885,977 | 5/1975 | Lachman et al. | 501/119 X |
| 3,950,175 | 4/1976 | Lachman et al. | 501/80 |
| 3,991,254 | 11/1976 | Takeuchi | 428/446 X |
| 4,001,028 | 1/1977 | Frost et al. | 501/80 |
| 4,015,048 | 3/1977 | Martin | 428/428 |
| 4,046,954 | 9/1977 | Ehman et al. | 428/446 |

Primary Examiner—Thomas J. Herbert
Attorney, Agent, or Firm—LeBlanc, Nolan, Shur & Nies

[57] ABSTRACT

Cordierite coatings capable of withstanding severe mechanical and thermal conditions. Methods of applying such coatings and components protected thereby.

16 Claims, 1 Drawing Figure

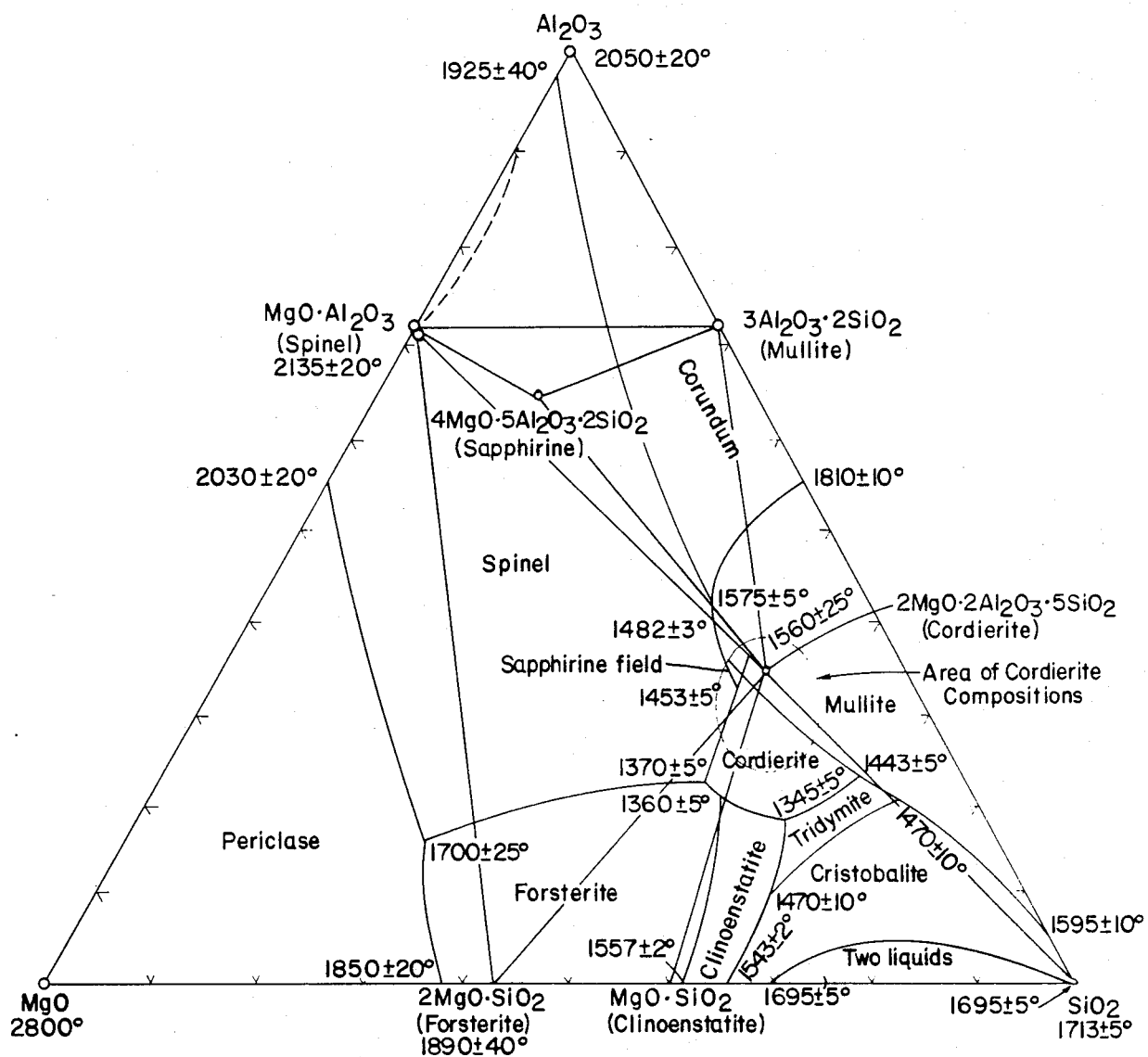

THERMALLY SPRAYABLE CERAMICS

This application is a continuation of application Ser. No. 294,250 filed Aug. 18, 1981 (now abandoned).

This invention relates to ceramic compounds and, more particularly, to fused ceramics in powdered form for thermal spray (flame and plasma) applications in order to obtain a controllable high porosity body for use as, for example, a thermal barrier, abradable seal.

It is well known that certain components in many industries are subject to extreme thermo-mechanical conditions. These conditions can give rise to failure of the components or restrict seriously the operational regimes of the components. For example, in gas turbine engines, high temperatures and thermal shock conditions must be carefully considered in systems design and materials specification. Parts must be protected from severe thermal and mechanical conditions, this frequently being accomplished by protective coatings. In gas turbine engines, for example, the wall of the shroud frequently comes in contact with the rotating turbine blade. It is desirable to create a gas path seal between the blade and the shroud, restricting gas leakage and permitting higher operating gas pressures and temperatures. Such sealing will increase operating efficiency.

The shroud wall, operating under severe mechanical (rubbing and erosion) and thermal conditions, must be protected, yet at the same time be able to accommodate the cutting action of the blade tip, which process affects a mechanical seal. If the seal thus formed is not properly abradable (i.e., the rubbing action causes material failure and spallation) or of insufficient thickness, the seal will be lost and/or the blades may be damaged, risking engine failure.

Abradable gas path seals for gas turbine engines are expected to be required to operate at increasing temperatures. High performance needs will include abradability and erosion resistance at temperatures approaching 2400° F. (1316° C.) with the seal material having low thermal conductivity to enable it to also act as a thermal barrier. Thermally sprayed oxides are excellent candidate materials for this need.

To endow the oxide with acceptable abradability, the seal material should be porous. The porosity also decreases thermal conductivity, enabling the system to operate at increased temperatures.

To enhance adhesion and mechanical performance it may be advisable to employ a graded coating (either continuously graded or layered), enabling the system to sustain residual tensile stresses generated through fabrication and arising from thermal cycling. Such grading with a high temperature alloy (e.g., CoCrAlY) thus permits higher performance behavior.

The above stated needs, as well as economic considerations of fabrication and repair procedures, indicate thermal spraying as the coating process of choice. Both combustion gun flame spraying and plasma spraying can be employed. They endow the oxide coating with considerable porosity and are simple and straightforward.

Currently, metal-polymer composites are flame sprayed on shrouds to furnish a seal. The resulting porous metal (the polymer is thought to be "burned-out" during the spraying process) gives a low temperature seal. Metal-graphite has been used as well. In order to increase operating temperature, however, refractory ceramics are required.

We have invented, and disclose herein, a new class of materials which satisfies all of the technical, processing, and economic needs for thermal barrier gas path seals. These novel materials are thermally sprayable powders formed from fully fused cordierite oxides. This material, when thermally sprayed by flame or plasma, yields a highly porous, highly thermal shock resistant, low thermal conductivity, well adhered oxide having excellent abradable and erosion resistant properties.

According to one feature of the invention, there is also provided a method of applying, in some cases and without a metal bond coat, a high porosity thermal barrier coating to a machine component by thermally spraying fused cordierite powder onto the component until a coating of desired thickness has been formed. The coating may be applied using any suitable thermal spray gun. Examples include combustion and plasma guns manufactured and/or marketed by Dresser Industries, Plasmadyne, Plasmatechnic, Metco, Electroplasma, and Castolin-Eutectic.

The fused cordierite may be applied at commercial rates and has been experimentally applied at three pounds per hour. Higher rates may be used depending upon the equipment and application. The spraying parameters are determined by the exact composition, particle size and retention time.

One exemplary material we have employed is in the cordierite-mullite family and has a typical composition as follows.

| $(2MgO.5SiO_2.2Al_2O_3)$ | |
| --- | --- |
| MgO | 13.7% wt. |
| $Al_2O_3$ | 34.9% wt. |
| $SiO_2$ | 51.4% wt. |

The melting temperature for the eutectic cordierite is 1470°±5° C.

The cordierite may be formed in a variety of known ways using a combination of materials such as: (i) clay, kyanite, pyrophillite, quartz, or silica; (ii) talc or the like; and (iii) alumina or aluminum hydroxide. Appropriate techniques for making our novel compositions from the foregoing raw materials will be apparent to those skilled in the relevant arts from, for example, U.S. Pat No. 3,950,175 issued Apr. 17, 1976, to Lachman et al which is hereby incorporated herein by reference.

Additives such as yttria, or yttrium, hafnium and other rare earths or their oxides may be added to the composition to improve the corrosion resistance, strength, and other properties of the coating. Typically, a rare earth additive such as yttrium will be added in amounts not exceeding four percent of the composition by weight. In fact, two weight percent may in many cases prove to be the practical maximum limit with one-half percent perhaps most often being preferred.

Also, mixtures of rare earths with refractory oxides such as zirconia can at times be employed to advantage in particular applications of our invention.

In cases where a mixture of additives is employed, on the other hand, larger amounts will typically be used. In the case of the yttria/zirconia combination of additives, for example, as much as ten weight percent of additive may be employed. Up to four weight percent of yttria can be used in this case with the balance being zirconia.

It is much preferred that the material have a uniform melting temperature and that all particles of the material have the same composition. These goals may be achieved by making up a cordierite forming mixture and then melting or fusing it before the material is melted in the thermal spray application step. This has the effect of removing low temperature phases which would otherwise mar or harm the properties of the coating to be formed. The material may be pre-reacted or fused using standard ceramic processes normally used to form the cordierite.

Additives such as yttria, hafnia, or various other rare earths may be included in the fused cordierite to modify the corrosion resistance, strength, adhesion, or other chemical and thermo-mechanical properties of the coating.

According to another feature of our invention, it is not absolutely necessary to precoat the substrate in many applications, but precoating may be done to improve its application for extremely corrosive environments. It is possible to use the material as a precoat for other ceramics because of its excellent adhesion to metal and its compatibility with other ceramics.

The thickness of our novel coatings can exceed other thermal spray applied ceramics with thicknesses exceeding 2 mm without loss of adhesion strength. The coating displays an excellent interface, giving good adhesion to the substrate.

An additional important and distinguishing feature of our novel product is its high potential for a significant exothermic release of energy. This is associated with recrystallization, the threshold temperature of which appears to be in excess of 850° C. and which will occur during thermal spraying and on the heating of the thus formed coating. This exothermic reaction is unique in thermal spray applied oxide ceramics and is important because it enhances cohesion and adhesive bond strengths.

Also exemplary of the applications in which the compositions disclosed herein can be employed to advantage as precoats are those in which the coated component is exposed to an erosive environment. In this case, erosion resistance can be significantly improved by first precoating the component being protected with a coating material as described herein and then superposing a coating of zirconia (which has excellent erosion resistance but inferior adhesion strength to metallic substrates). Because our novel coatings adhere tightly to metals and are also compatible with ceramics, therefore also adhering tightly to them, they furnish excellent interfaces between the metallic substrate and the erosion resistant zirconia.

Another previously mentioned way in which our novel coating compositions can be employed to advantage in environments such as those just discussed, for example, is in the form of graded coatings; i.e., coatings in which that portion adjoining the metallic substrate is of the character described above and in which the composition changes from that to one of a different character (for example, essentially zirconia) at the exposed surface of the coating. This can be accomplished either by applying superposed discrete coatings of different compositions or by continuously varying the composition of the coating over its thickness. Both techniques are well developed, and either can be employed.

According to another aspect of the invention, there is provided a machine component having thereon a coating of a material comprising a cordierite.

The coating is characterized by outstanding thermal shock resistance and excellent thermal barrier properties. The coating has a controllable porosity range of up to 40 volume percent, which is an unusually high level, in that other materials do not provide reliable porosities much in excess of 25 volume percent.

Porosity is important for the reasons discussed above. That parameter is measured by sectioning the coating and measuring the percentage of the surface of the exposed face which is made up of pores.

Organic and inorganic additives may be included to fill some or all of the pores to modify the properties of our novel coatings, depending upon the temperature of utilization.

For example, pore filling additives may be employed to keep corrosive material in the ambient environment from penetrating to the coated substrate or to keep cracks from developing in the coating. Or, the pores may be filled with an appropriate lubricant such as Teflon, molybdenum disulfide, or graphite to improve lubricity in applications where the component functions as a bearing or is otherwise in moving contact with another component.

The porosity of the coating material can be varied in several ways; e.g., by varying the spray rate and spray temperature. Also, porosity may be controlled, if a plasma arc gun is employed, by regulating the voltage across, and/or current between, the electrodes of the plasma arc gun (this is a common capability of those devices).

Porosity may also be controlled by varying the distance between the thermal spray gun and the target or component being coated. As the distance between the gun and the target is increased, the coating will become more porous.

In addition to having the desirable properties identified above, the novel coating materials we have invented are useful because of their vibration and sound absorbing properties. Consequently, the emphasis on thermal properties is not intended to limit the scope of our invention or the applications of that invention intended to be encompassed in the appended claims.

The machine component to which our coating materials are applied may be part of a rocket engine, an aircraft jet engine, an abradable seal, an aircraft carrier structural member, or any other application requiring a thermal barrier coating.

One important object of our invention resides in the provision of novel, improved ceramic compositions.

Related, but more specific objects of our invention reside in the provision of compositions in accord with the preceding object:
which are tightly adherable to metallic surfaces;
which are porous and abradable but erosion resistant;
which are temperature resistant and have low thermal conductivity;
which can be thermally sprayed;
which are resistant to thermal shock and otherwise have excellent mechanical properties;
which are members of the cordierite-mullite family;
which, in conjunction with the preceding object, contain rare earth metal and/or other additives capable of improving such properties of the composition as strength and corrosion resistance.

Yet another important and primary object of our invention resides in the provision of techniques for applying the novel compositions disclosed herein.

A related, also important but more specific, object of the invention resides in the novel use of thermal spraying techniques for applying the aforesaid compositions.

Still another important and primary object of our invention resides in the provision of novel, improved methods of protecting machine components against severe thermal and mechanical conditions by coating them with compositions as disclosed herein and characterized in the preceding objects.

Certain primary objects of our invention have been identified above. Other important objects and novel features of that invention will become apparent from the appended claims, from the illustrative example of how our invention be can be applied that follows, and from the drawing.

BRIEF DESCRIPTION OF THE DRAWING

The single FIGURE of the drawing is a phase diagram showing in the area encircled by a phantom line the full range of the ceramic compositions we employ in the coatings we have invented and disclosed herein.

Fused cordierite, made by melting the raw materials identified above in the specified proportions in a fusion furnace and reducing the resulting solid composition to a −61 to +11 microns powder, was sprayed at a rate of 3 lbs/hour through a Metco 3MB gun onto a steel substrate to a thickness in excess of 2 mm.

The coating thus formed was found to have the following properties:

|  |  |  |
| --- | --- | --- |
|  | Profile microhardness | 600–700 at 15 gram load |
| Superficial hardness | Rockwell | $R_B$ 70 |
| Metallograph | Microscope | Lamillar structure; interlamillar porosity |
| Porosity | By optical metallograph | 20%–40%; porosity; mainly discontinuous |
| Thermal test | 12 times .25 mm from nozzle of 35 KW argon-hydrogen plasma. Heated till substrate was red-white hot - then water quenched | No spalling, peeling or cracking |
| Thickness | Continuous overcoating | 2.5 mm (not the limit of thickness) |
| Bond test | Substrate - 10 × 10 × 2 mm | No interfacial failure to angles greater than 90° (approximately 120°) |
| Crystallinity | X-Ray powder diffraction methods | As sprayed structure is amorphous; crystallization temperature appears to be in excess of 850° C. |

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description; and all changes which come within the meaning and range of equivalency of the claims are therefore intended to be embraced therein.

What is claimed and desired to be secured by Letters Patent is:

1. A component comprised of a substrate which has a metallic surface and which is susceptible to abrasion and erosion at high temperatures and a porous, abradable, erosion, shock and temperature resistant, triple oxide coating which has low thermal conductivity tightly bonded to said metallic surface of said substrate, said coating being, at least in part, a reaction product of a fully fused, thermally sprayable cordierite coating precursor which is capable of releasing sufficient exothermic energy when heated to promote adhesion between the coating and the substrate.

2. A component comprised of a substrate which has a metallic surface and a coating which is capable of absorbing sound and/or other vibrations tightly bonded to said metallic surface of said substrate, said coating being, at least in part, a reaction product of a fully fused, thermally sprayable cordierite coating precursor which is capable of releasing sufficient exothermic energy when heated to promote the adhesion of the coating to the substrate.

3. A component as defined in claim 1 or in claim 2 wherein said fully fused, thermally sprayable cordierite coating precursor is essentially a single phase composition in the cordierite-mullite family.

4. A component as defined in claim 1 or in claim 2 wherein said fully fused, thermally sprayable cordierite coating precursor is obtained by melting together a mixture of magnesium oxide, aluminum oxide, and silicon oxide, said precursor having a composition bounded by the phantom line in the drawing.

5. A component as defined in claim 1 or in claim 2 in which the coating consists essentially of the reaction product of a fully fused, thermally sprayable coating precursor as aforesaid.

6. A component as defined in claim 1 or in claim 2 wherein the cordierite constituent of said coating precursor has the formula $2MgO5SiO_2 2Al_2O_3$.

7. A component comprised of a substrate which is susceptible to abrasion and erosion at high temperatures and a porous, abradable, erosion, shock and temperature resistant, triple oxide coating which has low thermal conductivity tightly bonded to said substrate, said coating being, at least in part, a reaction product of a fused, thermally sprayable cordierite coating precursor which is capable of undergoing an exothermic reaction when heated, said coating also including a rare earth metal or rare earth metal oxide in an amount effective to favorably influence a desirable property of the coating such as adhesion, strength, or corrosion resistance.

8. A component comprised of a substrate and a coating which is capable of absorbing sound and/or other vibrations tightly bonded to said substrate, said coating being, at least in part, a reaction product of a fused, thermally sprayable cordierite coating precursor which is capable of undergoing an exothermic reaction when heated, said coating also including a rare earth metal or rare earth metal oxide in an amount effective to favorably influence a desirable property of the coating such as adhesion, strength or corrosion resistance.

9. A component comprised of a substrate which is susceptible to abrasion and erosion at high temperatures and a porous, abradable, erosion, shock and temperature resistant, triple oxide coating which has low thermal conductivity tightly bonded to said substrate, said coating being, at least in part, a reaction product of a fused, thermally sprayable cordierite coating precursor which is capable of undergoing an exothermic reaction when heated, said coating also including the combination of a rare earth metal or rare earth metal oxide and a refractory oxide.

10. A component comprised of a substrate and a coating which is capable of absorbing sound and/or other vibrations tightly bonded to said substrate, said coating being, at least in part, a reaction product of a fused, thermally sprayable cordierite coating precursor which is capable of undergoing an exothermic reaction when heated, said coating also including the combination of a rare earth metal or rare earth metal oxide and a refractory oxide.

11. A component as defined in any one of claims 7–10 wherein the rare earth metal constituent is yttrium or hafnium or an oxide of yttrium or hafnium.

12. A component comprised of a substrate which is susceptible to abrasion and erosion at high temperatures and a porous, abradable, shock and temperature resistant, triple oxide coating which has low thermal conductivity tightly bonded to said substrate, said coating being, at least in part, a reaction product of a fused, thermally sprayable cordierite coating precursor which is capable of undergoing an exothermic reaction when heated, at least the pores of the cordierite constituent of said coating being filled with a substance which is capable of keeping corrosive material in the ambient environment from penetrating to the coating substrate or a substance which is capable of keeping cracks from developing in the coating or with a lubricant.

13. A component comprised of a substrate and a coating which is capable of absorbing sound and/or other vibrations tightly bonded to said substrate, said coating being, at least in part, a reaction product of a fused, thermally sprayable cordierite coating precursor which is capable of undergoing an exothermaic reaction when heated, at least the pores of the cordierite consittuent of said coating being filled with a substance which is capable of keeping corrosive material in the ambient environment from penetrating to the coating substrate or with a substance which is capable of keeping cracks from developing in the coating or with a lubricant.

14. A component comprised of a substrate which is susceptible to abrasion and erosion at high temperatures; a porous, abradable, erosion, shock and temperature resistant, triple oxide coating which has low thermal conductivity tightly bonded to said substrate, said coating being, at least in part, a reaction product of a fused, thermally sprayable cordierite coating precursor which is capable of undergoing an exothermic reaction when heated; and a layer of an erosion resistant refractory oxide overlying and bonded to said substrate, said coating being, at least in part, a reaction product of a fused, thermally sprayable cordierite coating precursor which is capable of undergoing an exothermic reaction when heated; and a layer of an erosion resistant refractory oxide overlying and bonded to said coating.

15. A component comprised of a substrate; a coating which is capable of absorbing sound and/or other vibrations tightly bonded to said substrate, said coating being, at least in part, a reaction product of a fused, thermally sprayable cordierite coating precursor which is capable of undergoing an exothermic reaction when heated; and a layer of an erosion resistant refractory oxide overlying and bonded to said coating.

16. A component as defined in claim 14 or in claim 15 wherein said refractory oxide is zirconia.

* * * * *